US009691866B2

(12) United States Patent
Regnier et al.

(10) Patent No.: US 9,691,866 B2
(45) Date of Patent: *Jun. 27, 2017

(54) MEMORY CELL HAVING A VERTICAL SELECTION GATE FORMED IN AN FDSOI SUBSTRATE

(71) Applicant: STMicroelectronics (Rousset) SAS, Rousset (FR)

(72) Inventors: Arnaud Regnier, Les Taillades (FR); Jean-Michel Mirabel, Cabries (FR); Stephan Niel, Meylan (FR); Francesco La Rosa, Rousset (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

This patent is subject to a terminal disclaimer.

(21) Appl. No.: 15/252,090

(22) Filed: Aug. 30, 2016

(65) Prior Publication Data

US 2016/0372561 A1 Dec. 22, 2016

Related U.S. Application Data

(62) Division of application No. 14/854,542, filed on Sep. 15, 2015, now Pat. No. 9,461,129.

(30) Foreign Application Priority Data

Dec. 17, 2014 (FR) ...................... 14 62642

(51) Int. Cl.
*H01L 29/423* (2006.01)
*H01L 27/11524* (2017.01)
(Continued)

(52) U.S. Cl.
CPC .... *H01L 29/42336* (2013.01); *G11C 16/0433* (2013.01); *H01L 27/11521* (2013.01);
(Continued)

(58) Field of Classification Search
CPC ...................... H01L 29/42356; H01L 29/4236
See application file for complete search history.

(56) References Cited

U.S. PATENT DOCUMENTS 5,412,600 A 5/1995 Nakajima
7,495,279 B2 2/2009 Shum et al.
(Continued)

OTHER PUBLICATIONS

Tang, P. et al., "Performance Improvement of Flash Memory with a Novel Quasi-SOI Structure," 9th International Conference on Solid-State and Integrated-Circuit Technology (ICSICT 2008), Beijing, China, pp. 846-849, Oct. 20-23, 2008.

*Primary Examiner* — Fei Fei Yeung Lopez
(74) *Attorney, Agent, or Firm* — Seed IP Law Group LLP

(57) ABSTRACT

A memory cell formed in a semiconductor substrate, includes a selection gate extending vertically in a trench made in the substrate, and isolated from the substrate by a first layer of gate oxide, a horizontal floating gate extending above the substrate and isolated from the substrate by a second layer of gate oxide, and a horizontal control gate extending above the floating gate. The selection gate covers a lateral face of the floating gate. The floating gate is separated from the selection gate only by the first layer of gate oxide, and separated from a vertical channel region, extending in the substrate along the selection gate, only by the second layer of gate oxide.

20 Claims, 7 Drawing Sheets

(51) Int. Cl.
*H01L 29/788* (2006.01)
*H01L 29/78* (2006.01)
*G11C 16/04* (2006.01)
*H01L 29/66* (2006.01)
*H01L 27/11521* (2017.01)

(52) U.S. Cl.
CPC .. *H01L 27/11524* (2013.01); *H01L 29/42324* (2013.01); *H01L 29/42328* (2013.01); *H01L 29/66825* (2013.01); *H01L 29/7831* (2013.01); *H01L 29/7881* (2013.01); *H01L 29/7885* (2013.01); *H01L 29/7889* (2013.01)

(56) References Cited

U.S. PATENT DOCUMENTS

| | | |
|---|---|---|
| 2004/0057286 A1 | 3/2004 | Chen et al. |
| 2004/0130947 A1 | 7/2004 | Fan et al. |
| 2005/0127428 A1 | 6/2005 | Mokhlesi et al. |
| 2006/0186456 A1 | 8/2006 | Burnett et al. |
| 2013/0228846 A1* | 9/2013 | La Rosa ............ H01L 29/7889 257/321 |
| 2013/0250700 A1 | 9/2013 | La Rosa |

* cited by examiner

S12

S13

S14

MEMORY CELL HAVING A VERTICAL SELECTION GATE FORMED IN AN FDSOI SUBSTRATE

BACKGROUND

Technical Field

The present disclosure relates to electrically erasable and programmable non-volatile memories (EEPROM). The present disclosure relates more particularly to a non-volatile memory, comprising memory cells each comprising a floating-gate transistor and a select transistor gate.

Description of the Related Art

Several solutions have been implemented to miniaturize such memory cells. Thus, the memory cells have been grouped together in pairs of so-called "twin" memory cells to share a single select transistor.

FIG. 1 is a wiring diagram of a pair of memory cells C11, C12 sharing a select transistor, belonging to two adjacent word lines W<i>, W<i+1> of a memory array. The memory cells C11, C12 are read- and write-accessible through a bit line BL<j>, a common select line SL<i> and control gate lines CGL<i>, CGL<i+1>. Each memory cell C11, C12 comprises a floating-gate transistor FGT. The control gate CG of the transistor FGT of each cell C11, C12 is connected to the control gate line CGL<i> through a contact C4. The drain regions of the transistors FGT are connected to a bit line BL through contacts C1. Furthermore, each floating-gate transistor FGT has its source terminal coupled to a source line CSL through a respective select transistor ST. The select transistors ST share a same select control gate SGC. The two memory cells C11, C12 are referred to as "twins" due to the fact that they share the same select control gate SGC and the same bit line BL. The common control gate SGC is connected to the select line SL<i> common to the two memory cells through a contact C3. The channel regions of the transistors FGT, ST are at the electric potential of the well PW, as represented by dotted lines. Finally, the source line CSL may be connected through a contact C5 to a general source line produced in a level of metal.

It has also been proposed to vertically arrange the select transistor. FIG. 2 is a schematic cross-section of two twin memory cells C11, C12, sharing a vertical select transistor gate SGC, common to two twin memory cells. The memory cells C11, C12 are produced in a P-type conductivity well PW. The well PW is formed in a semiconductor wafer WF. The well PW is isolated from the rest of the wafer WF by an N-doped isolation layer n0 surrounding the entire well. Each memory cell C11, C12 comprises a floating-gate transistor FGT and a select transistor ST. Each floating-gate transistor FGT comprises a drain region n1, a source region n2, a floating gate FG, a state control gate CG, and a channel region CH1 extending beneath the floating gate FG between the drain n1 and source n2 regions. The vertical selection gate SGC is embedded in the substrate PW and isolated from the latter by a layer of gate oxide D3, for example made of silicon dioxide $SiO_2$, forming the gate oxide of the select transistor ST. The region n2 extends along an upper edge of the embedded vertical gate SGC. The gate SGC reaches the region n0 forming a source region n0 common to the select transistors ST, and thus forms a source line CSL of the select transistors ST. Each select transistor ST thus comprises a drain region common to the source region n2 of the floating-gate transistor FGT of its cell, the common source region n0, and a channel region CH2 extending vertically along the gate SGC between the drain n2 and source n0 regions.

The regions n1, n2 are generally formed by N-doping of the substrate PW. The floating gates FG are generally made of level-1 polycrystalline silicon, or "poly1", and are formed on the substrate PW through a layer of gate oxide D1. The state control gates CG are generally made of level-2 polycrystalline silicon, or "poly2". Each state control gate CG is formed on one of the floating gates FG previously covered with a layer of gate oxide D2. The gate SGC is formed in a trench filled with level-0 polycrystalline silicon, or "poly0", isolated from the substrate by the layer of gate oxide D3. Depending on the manufacturing method chosen, the conducting trench forming the gate SGC may not have any electrical discontinuity. It may then be used directly as word line WL.

The two memory cells C11, C12 are covered with a dielectric insulating material D0, which may also be silicon dioxide $SiO_2$. The drain regions n1 of the floating-gate transistors FGT are coupled to a same bit line BL through a contact C1 passing through the insulating material D0.

Such memory cells are channel-erased or programmed, i.e., by putting the substrate to a positive erase voltage or negative programming voltage causing electric charges to be extracted from their floating gates or electric charges to be injected into their floating gates, by Fowler Nordheim effect or by hot electron injection.

More particularly, a memory cell is erased by combining the positive voltage applied to the substrate with a negative voltage applied to the control gate CG of its floating-gate transistor, while the control gate of the floating-gate transistor of the twin memory cell receives a positive erase-inhibit voltage preventing it from being simultaneously erased.

Similarly, a memory cell is programmed by combining a negative voltage applied to the bit line BL and to the substrate PW, with a positive voltage applied to the control gate CG of its floating-gate transistor, while the control gate of the floating-gate transistor of the twin memory cell receives a negative program-inhibit voltage preventing it from being simultaneously programmed.

Finally, a memory cell is read by applying a positive voltage to the control gate of its floating-gate transistor, as well as a positive voltage to the corresponding bit line, while the twin memory cell, which is connected to the same bit line, receives on its control gate a negative read-inhibit voltage preventing it from being simultaneously read.

Furthermore, for the sake of miniaturization in particular, the technology of transistors with a thin film of Fully-Depleted Silicon On Insulator (FDSOI) has been developed. This technology has several decisive advantages for future generations of technology. First of all, thanks to the use of a thin film of silicon, the electrostatic control via the gate of the channel of CMOS-type transistors is much improved compared to that of a conventional transistor produced on a massive silicon substrate. This excellent control enables, on one hand, the performance/consumption compromise of integrated circuits to be improved, and on the other hand, offers the FDSOI technology high potential for miniaturization. Then, compared to the FinFET technologies (Fin-Shaped Field Effect Transistor), which also have a very good electrostatic control, the FDSOI technology represents a disruptive technology that is easier to be produced, the transistor being planar with an architecture very similar to that of conventional technologies. Therefore the manufacturing methods are much simpler.

It is thus desirable to produce non-volatile memory cells in an FDSOI-type substrate in which logic circuits are produced based on CMOS transistors. It is also desirable to further miniaturize the non-volatile memory cells and to simplify the control of such memory cells.

BRIEF SUMMARY

Some embodiments relate to a memory cell formed in a semiconductor substrate, comprising a selection gate extending vertically in a trench made in the substrate, and isolated from the substrate by a first layer of gate oxide, a horizontal floating gate extending above the substrate and isolated from the substrate by a second layer of gate oxide, and a horizontal control gate extending above the floating gate. According to one embodiment, the selection gate covers a lateral face of the floating gate, the floating gate being separated from the selection gate only by the first layer of gate oxide, and separated from a vertical channel region extending in the substrate along the selection gate, only by the second layer of gate oxide.

According to one embodiment, the substrate belongs to a fully-depleted silicon on insulator-type wafer, comprising a dielectric layer formed on the substrate and a layer of silicon formed on the dielectric layer, the floating gate being formed in the layer of silicon, and the second layer of gate oxide being formed in the dielectric layer.

According to one embodiment, the memory cell comprises an embedded layer forming a collective source plane in electrical contact with the vertical channel region, for the collection of programming currents for programming the memory cell and other memory cells formed in the substrate.

Some embodiments also relate to a group of memory cells, comprising a first and a second memory cell as previously defined, sharing the same vertical selection gate.

Some embodiments also relate to a memory circuit comprising a memory array comprising a plurality of memory cells as previously defined.

Some embodiments also relate to a memory circuit comprising at least one memory cell as previously defined, and a circuit for programming the memory cell, configured to apply electric potentials to the substrate, to the vertical selection gate, to the control gate and to drain and source regions of the memory cell, such that hot electrons are injected into the floating gate via the vertical channel region through the second layer of gate oxide.

Some embodiments also relate to a memory circuit comprising at least one memory cell as previously defined, and a circuit for erasing the memory cell, configured to apply electric potentials to the substrate, to the vertical selection gate, to the control gate and to drain and source regions of the memory cell, such that electric charges are extracted from the floating gate directly via the vertical selection gate.

Some embodiments also relate to a method for manufacturing in a semiconductor substrate an electrically programmable memory cell, the method comprising the steps of: etching a first trench in the substrate, and in a first dielectric layer and a first conducting layer formed on the substrate, depositing on the walls of the first trench a second dielectric layer, depositing on the substrate and in the first trench a second conducting layer and etching the second conducting layer to form a vertical selection gate extending in the first trench, up to a plane passing through an upper face of the first conducting layer, depositing on the substrate a third dielectric layer, depositing on the third dielectric layer a third conducting layer, etching a second trench in the third conducting layer, the third dielectric layer, the first conducting layer and the first dielectric layer, and etching a third trench above the vertical selection gate through the third conducting layer and the third dielectric layer, so as to form between the second and third trenches a first stack of a control gate and of a floating gate of the memory cell.

According to one embodiment, the substrate belongs to a fully-depleted silicon on insulator-type wafer, comprising the first dielectric layer and the first conducting layer made of silicon.

According to one embodiment, the method comprises a step of etching a fourth trench in the third conducting layer, the third dielectric layer, the first conducting layer and the first dielectric layer, to form between the third and fourth trenches a second stack of a control gate and of a floating gate of a twin memory cell sharing the vertical selection gate with the memory cell.

According to one embodiment, the method comprises a preliminary step of implanting in the substrate a conducting plane forming a source line for the memory cell.

According to one embodiment, the method comprises a step of implanting dopants at the bottom of the second trench to form a drain region of a floating-gate transistor.

According to one embodiment, the first dielectric layer has a thickness between 10 and 30 nm and the first conducting layer has a thickness between 8 and 15 nm.

Some embodiments also relate to a method for manufacturing an integrated circuit on a semiconductor wafer including the method of manufacturing a memory cell as previously defined.

BRIEF DESCRIPTION OF THE SEVERAL VIEWS OF THE DRAWINGS

Some examples of embodiments of the present disclosure will be described below in relation with, but not limited to, the accompanying figures, in which.

DETAILED DESCRIPTION

Figure 3:
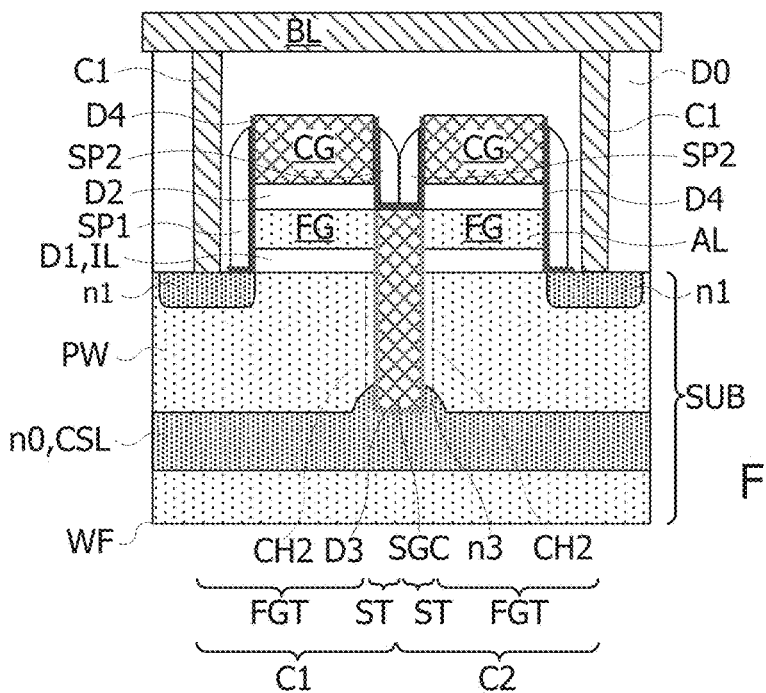
FIG. 3 is a schematic cross-section of a pair of twin memory cells sharing a common vertical select transistor gate, according to one embodiment.

FIG. 3 represents two twin memory cells C1, C2, according to one embodiment. The memory cells C1, C2 are produced in a P-type conductivity substrate PW. The substrate is formed by a well PW produced in a semiconductor wafer WF. The well PW is isolated from the rest of the wafer WF by an N-doped isolation layer n0 surrounding the entire well. The memory cells C1, C2 have a vertical select transistor gate SGC, common to the two memory cells. Each memory cell C1, C2 comprises a section of floating-gate transistor FGT and a section of select transistor ST. Each section of floating-gate transistor FGT comprises a drain region n1, and a gate stack comprising a floating gate FG and a state control gate CG separated by a layer of gate oxide D2, the floating gate FG being isolated from the well PW by a layer of gate oxide D1.

According to one embodiment, the vertical selection gate SGC is produced in a trench formed in the well PW and through the gate stacks of the sections of floating-gate transistor, and extends between a source region n3 common to the transistor ST sections and the floating gates FG or the layers of gate oxide D2 of the twin cells C1, C2. The vertical gate SGC covers lateral sides of the floating gates FG of the memory cells C1, C2 and is isolated from these floating gates and from the well PW only by a dielectric layer D3, for example made of silicon dioxide SiO2, forming the gate oxide of the sections of select transistors ST. The source region n3 formed in the well PW is in electrical contact with the isolation layer n0 which thus forms a source line CSL of the transistor ST sections. The region n3 extends along two lower edges of the vertical gate SGC. Each select transistor ST section thus comprises the common source region n3, and a channel region CH2 extending vertically along the selection gate SGC between the floating gate FG and the source region n3. It shall be noted that the region n3 may be omitted if the selection gate SGC reaches the layer n0.

The parts of the lateral sides of the gate stacks of the floating-gate transistor FGT sections not covered with the selection gate SGC may be covered with a dielectric layer D4. Spacers SP1, SP2 may be formed on the layer D4. Thus, the spacers SP1 are formed above the drain regions n1 and the spacers SP2 are formed above the selection gate SGC. The spacers SP1, SP2 may be conventionally formed by depositing on the substrate SUB or on the gate SGC a dielectric layer made, for example, of silicon dioxide or silicon nitride, and by plasma anisotropic etching of this dielectric layer.

The twin memory cells C1, C2 are covered with a dielectric insulating material D0, which may also be silicon dioxide $SiO_2$. Each of the drain regions n1 of the transistor FGT sections of the cells C1, C2 is coupled to a common bit line BL through a contact C1 passing through the insulating material D0.

The regions n0, n1, n3 are generally formed by N-doping of the substrate PW. The gates FG, CG, ST are generally made of polycrystalline silicon. The conducting trench forming the gate SGC may not have any electrical discontinuity (in a direction perpendicular to the plane of the figure). It may then be used directly as word line WL.

According to one embodiment, the memory cells C1, C2 are produced in an FDSOI wafer WF comprising a semiconductor substrate SUB having an upper face covered with an insulating layer IL, the insulating layer IL being itself covered with an upper active layer AL made of a semiconductor material, for example of silicon. The well PW and the regions n0, n1 and n3 are formed by implanting dopants in the substrate SUB, the layers of gate oxide D1 isolating the floating gates FG of the well PW are formed in the layer IL, and the floating gates FG are formed in the active layer AL.

Thus, the gate SGC may be formed in a trench filled with level-0 polycrystalline silicon, or "poly0", isolated from the substrate by the layer of gate oxide D3, and the state control gates CG may be made of level-1 polycrystalline silicon, or "poly1" or in a metal layer.

Figure 4:
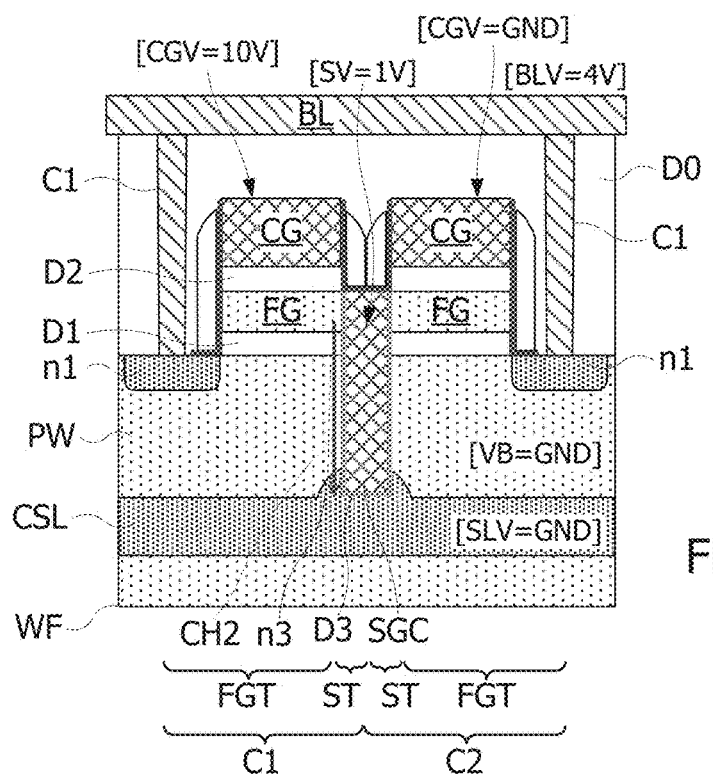
FIG. 4 is a schematic cross-section of the pair of memory cells of FIG. 3, showing a method for programming a memory cell, according to one embodiment.

FIG. 4 shows a hot-electron programming operation for programming the memory cell C1, and provides, for information, values of voltages applied for this purpose to the memory cells C1, C2. To perform this operation, the bit line BL is subjected to a voltage BLV for example equal to 4V, the gate SGC receives a voltage SV for example equal to 1V, and the control gate CG of the memory cell C1 receives a programming voltage CGV which may be set to 10V. The well PW and the source line CSL are grounded (GND). In these conditions, the transistor FGT section of the memory cell C1 and the transistor ST section of the pair of memory cells C1, C2 cooperate in order to inject electric charges into the floating gate FG through the layer of gate oxide D1. The select transistor ST section has a conducting channel CH2 in which a current (represented by an arrow on FIG. 4) forms, comprising high kinetic energy electrons, referred to as "hot electrons". When the current I1 reaches the insulating layer IL beneath the floating gate FG of the cell C1, an injection zone forms where certain high energy electrons are injected into the floating gate FG under the effect of a transverse electric field created by the voltage applied to the control gate CG. The charges are thus transferred from the substrate PW to the floating gate FG (programming) by passing through the channel CH2 of the select transistor ST section, and by applying a high difference in potential (here 10V) to the floating gate FG through the control gate CG, to obtain this charge transfer. It can be noted that in the twin cell C2, the control gate CG is grounded. Despite the presence of a voltage of 1V in the selection gate SGC, no current circulates in the channel CH2 of the cell C2, since the control gate CG, and thus the floating gate, and the well PW and the source line CSL are grounded GND. The result is that the cell C2 does not consume any current.

Figure 5:
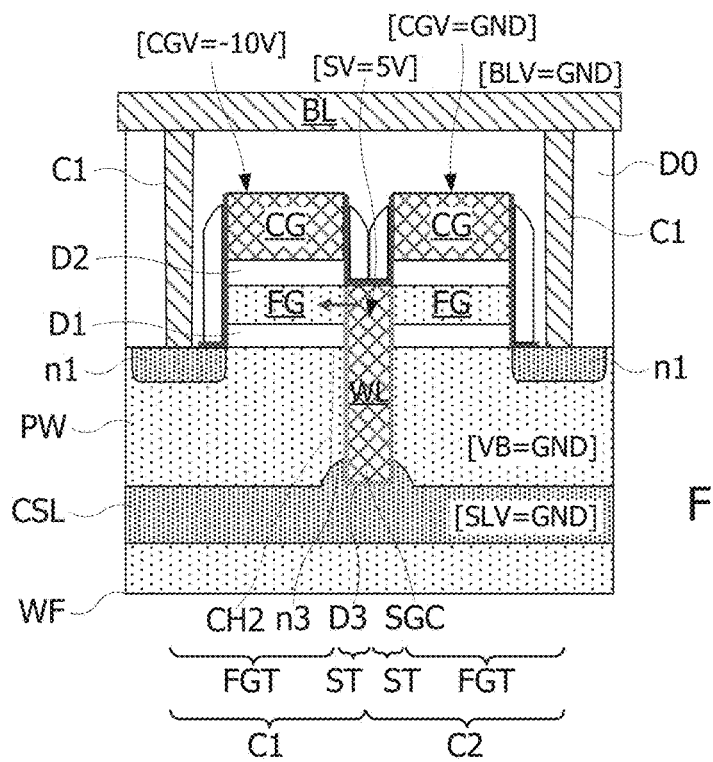
FIG. 5 is a schematic cross-section of the pair of memory cells in FIG. 3, showing a method for erasing the pair of memory cells, according to one embodiment.

FIG. 5 shows an operation of erasing the memory cell C1, and provides, for information, values of voltages applied for this purpose to the memory cells C1, C2. To perform this operation, the bit line BL is grounded, the selection gate SGC receives an erase voltage for example equal to 5V, and the control gate CG of the memory cell C1 receives a programming voltage CGV which may be set to −10V. The well PW and the source line CSL may remain grounded (GND). In these conditions, the erasing is performed without going through the well PW, by applying a high electric field (here 10V) between the selection gate SGC and the floating gate FG of the memory cell to be erased. Thus, the electrons are extracted from the floating gate by tunnel effect (Fowler-Nordheim) through the layer of gate oxide D3 of the selection gate SGC. The erasing of the twin memory cell C2 is prevented merely by grounding the control gate CG of this memory cell. The erasing of memory cells is thus controlled by the control gate CG. It may therefore be performed by page of memory cells or word line WL.

One of the two memory cells C1, C2 may be read by applying a positive voltage to its control gate CG, as well as a positive voltage to the corresponding bit line, while the twin memory cell, which is connected to the same bit line, receives on its control gate a negative read-inhibit voltage preventing it from being simultaneously read.

Figure 1:
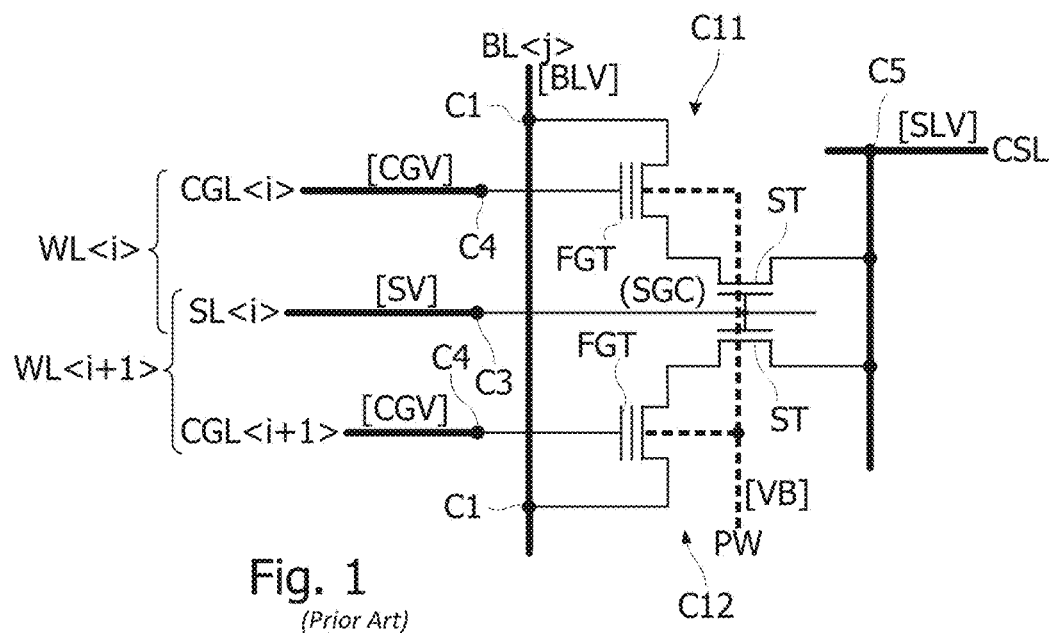
FIG. 1 described above represents an electric circuit of a pair of memory cells sharing a common select transistor gate, FIG. 2 described above is a schematic cross-section of a pair of twin memory cells sharing a common vertical select transistor gate.
Figure 2:
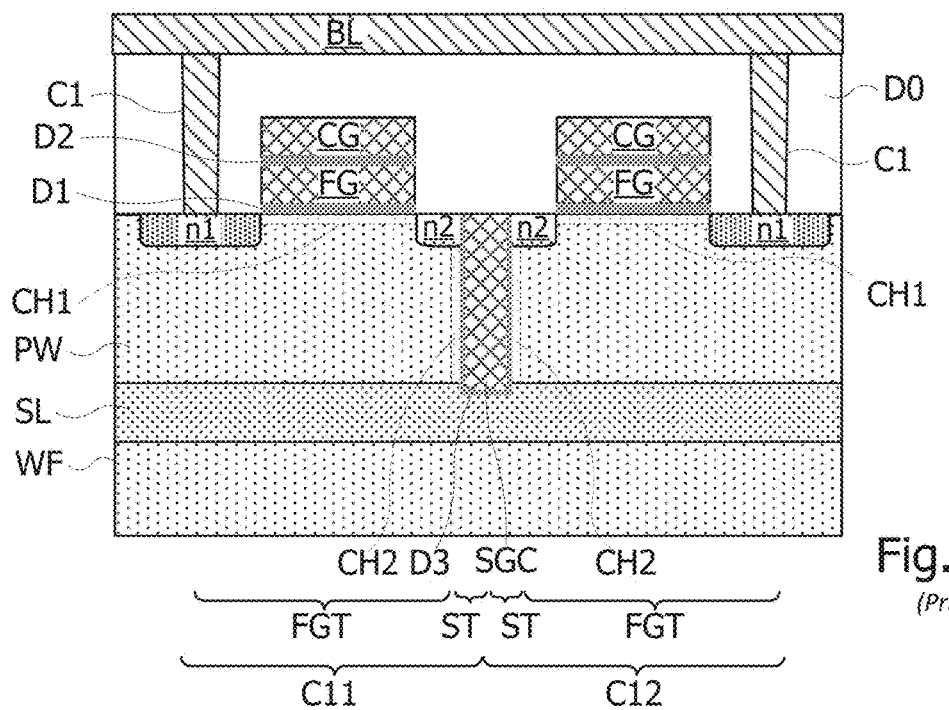

Thus, the programming and erasing operations are performed by transferring electrons through two different gate dielectric layers, the programming being performed through the layer of gate oxide D1, and the erasing through the layer of gate oxide D3. The result is that the memory cells may undergo a higher number of programming/erasing cycles than conventional memory cells or the ones represented in FIG. 2. The result is also that the well PW does not undergo any stress during these operations.

It shall be noted that STI-type shallow isolation trenches are formed in the substrate in parallel to the bit lines BL to isolate rows or pairs of rows of memory cells from one another.

Figure 6A:
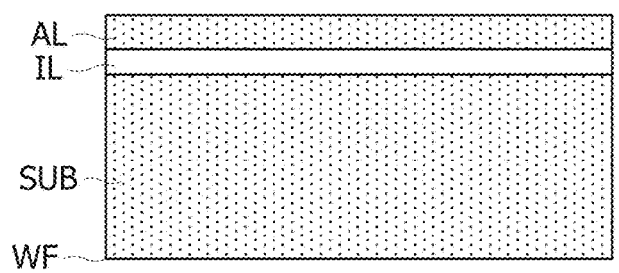
FIGS. 6A to 6G are schematic cross-sections showing steps of a method for manufacturing memory cells, according to one embodiment.

FIG. 6A shows an FDSOI wafer WF used to produce memory cells. The wafer WF comprises the semiconductor substrate SUB, for example made of silicon, having an upper face covered with the dielectric layer IL, the dielectric layer IL being itself covered with the upper active layer AL made of a semiconductor material, for example of silicon. For technologies at 28 nm or lower, the insulating layer IL may have a thickness between 10 and 30 nm and the upper active layer AL may have a thickness between 8 and 15 nm.

Figure 6B:
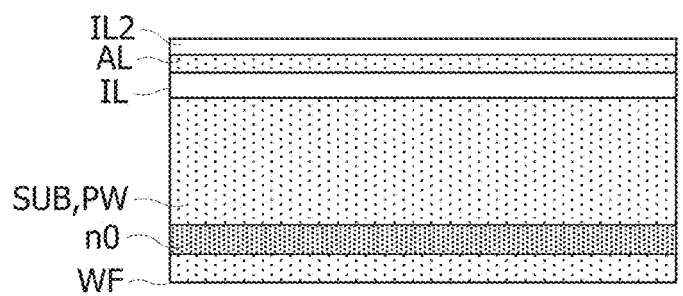

During steps S11 shown by FIG. 6B, a dielectric layer IL2 is formed on the surface of the wafer WF. This layer may be formed by depositing or by partially oxidizing the active layer AL. The deep doped layer n0 is implanted deep down in the substrate SUB beneath the dielectric layer IL. This layer is for example the N-type layer to isolate a P-type well formed in the substrate SUB. The layer n0 will be used as source line CSL for all the memory cells implanted in the substrate, more precisely a collective source plane, capable of collecting the programming currents for programming several memory cells. Then, the substrate SUB between the layers n0 and IL is doped to form the P-type conductivity well PW.

Figure 6C:
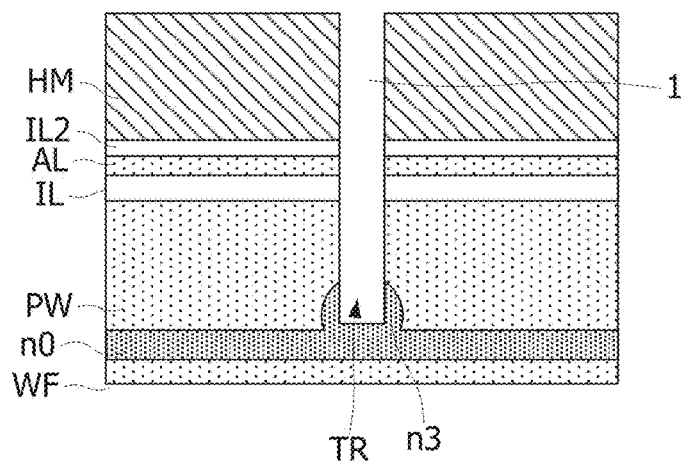

During steps S12 shown by FIG. 6C, a layer of hard mask HM is formed on the dielectric layer IL2, by depositing or growing one or more layers made, for example, of silicon dioxide or silicon nitride. A light-sensitive resin mask is then deposited on the mask HM, then developed so as to form an opening in the resin mask. The mask HM is then etched through the resin mask so as to form a corresponding opening 1 in the mask HM, and the resin mask is then removed. A trench TR is formed in the layers IL2, AL, IL and in the well PW by etching through the opening 1 in the mask HM. A deep doped pocket forming the region n3 is implanted in the well PW through the trench TR in the vicinity of the bottom of the latter. The region n3 is formed by vertical ion implantation, and remains localized in the region of the well situated in the vicinity of the bottom of the trench TR. The region n3 extends to the doped layer n0 and will thus be used as source region for the pair of memory cells being formed, whereas the doped layer n0 will be used as source line CSL in the continuation of the source region n3. In one alternative embodiment, the region n3 is not implanted and the trench TR is etched over a greater depth so as to reach the layer n0, which will be used as source region and source line.

Figure 6D:
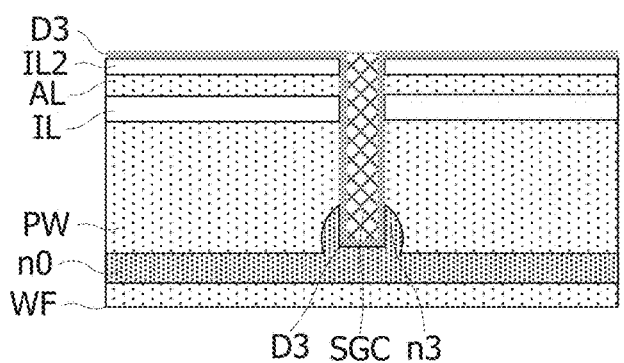

During steps S13 shown by FIG. 6D, the hard mask HM is removed and the dielectric layer D3 is formed on the walls of the trench TR and on the surface of the layer IL2, for example by growing silicon dioxide, to form the gate oxide of the vertical gate SGC. A conducting layer made, for example, of polysilicon, is then deposited over the entire substrate SUB, as well as inside the trench TR to form the vertical gate SGC.

The conducting layer is then withdrawn out of the trench TR up to the level of the dielectric layer D3 on the layer IL2.

Figure 6E:
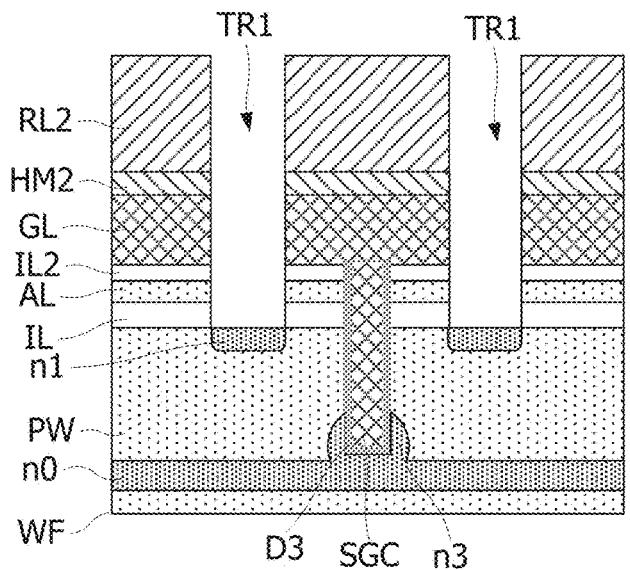

During steps S14 shown by FIG. 6E, a conducting layer GL is deposited on the dielectric layer D3, then a layer of hard mask HM2. A light-sensitive resin mask RL2 is then deposited on the mask HM2, then developed so as to form openings in the resin mask on either side of the gate SGC.

The mask HM2 is then etched through the resin mask so as to form corresponding trenches TR1 in the mask HM2. The trenches TR1 are deepened in the layers GL, IL2, AL, IL, until they reach the upper surface of the well PW, by etching through the mask HM2. The doped regions n1 are implanted in the well PW at the bottom of the trenches TR1. The layers between the trenches TR1 are thus provided to form the gate stacks of the floating-gate transistor FGT sections of the twin memory cells. The conducting layer GL which is provided to form the control gates CG, may be made of polysilicon or metal.

Figure 6F:
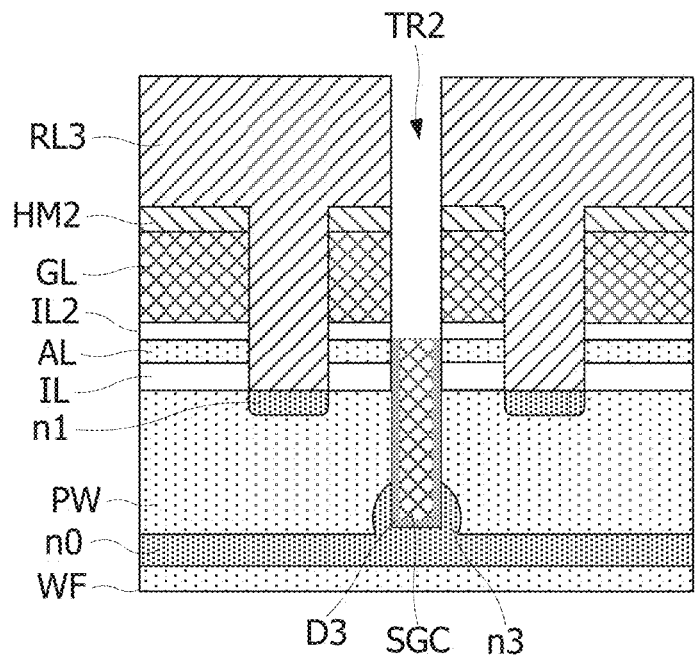

During steps S15 shown by FIG. 6F, the resin mask RL2 is removed, and a new light-sensitive resin mask RL3 is deposited on the mask HM2 and in the trenches TR1, then developed so as to form an opening in the resin mask RL3 above the gate SGC. The mask HM2 is then etched through the resin mask so as to form a corresponding trench TR2 in the mask HM2, and the resin mask RL3 is removed. The trench TR2 is deepened through the layers GL and IL2 until it reaches the upper surface of the gate SGC, by etching through the mask HM2.

Figure 6G:
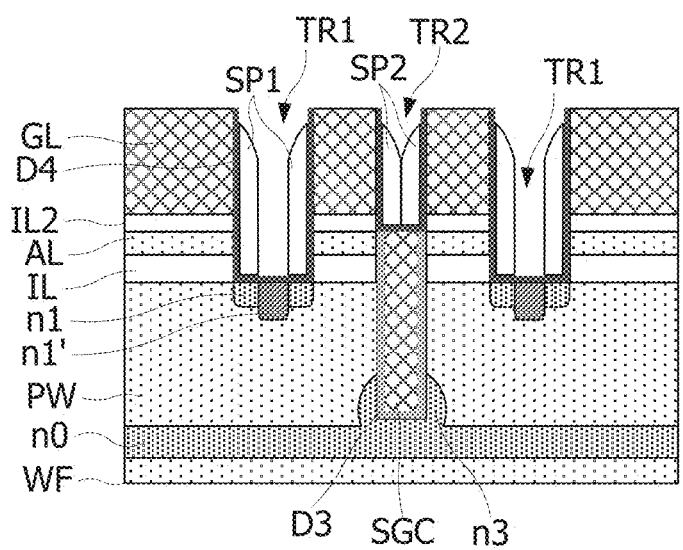

During steps S16 shown by FIG. 6G, the resin mask RL3 and the hard mask HM2 are removed. The dielectric layer D4 is deposited on the layer GL and in the trenches TR, TR2, and the spacers SP1, SP2 may be formed on the walls of the trenches TR1, TR2. The dielectric layer D4 may then be removed from the upper face of the layer GL forming the control gates CG of the floating-gate transistor FGT sections.

Figure 7:
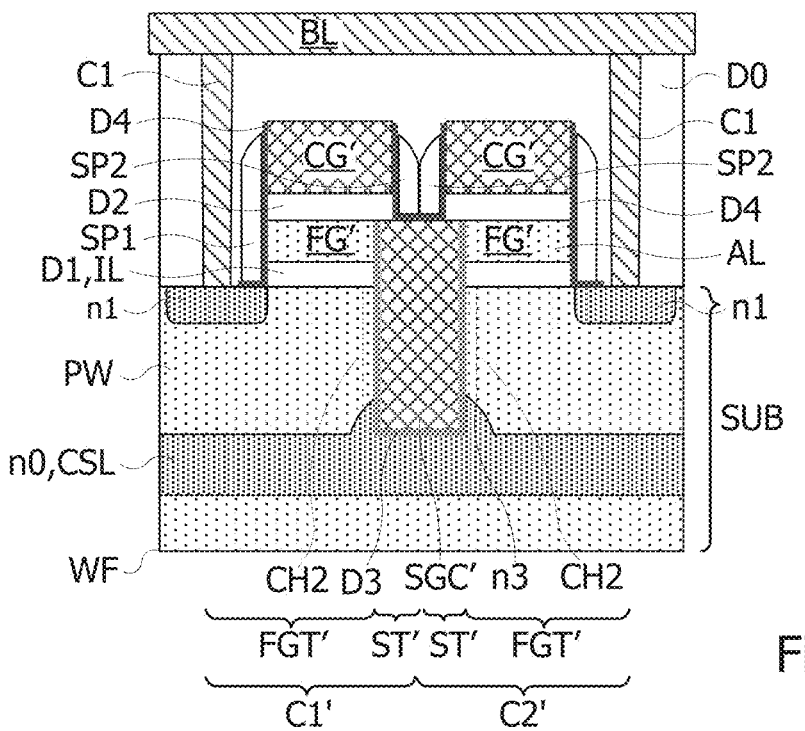
FIG. 7 is a schematic cross-section of a pair of twin memory cells sharing a common vertical select transistor gate, according to another embodiment.

It shall be noted that the trenches TR and TR2 are not necessarily exactly aligned, or of the same width. In particular, the trench TR2 may be narrower on one side or on both sides than the trench TR. In this latter case, the structure of memory cells C1', C2' represented in FIG. 7 is obtained. The memory cells C1', C2' differ from the memory cells C1, C2 in that they comprise a common selection gate SGC', not necessarily wider, but partly extending beneath the layer of gate oxide D2. The result is that the floating-gate transistors FGT' of the memory cells C1', C2' may comprise a layer of gate oxide D2 and a control gate CG' wider than their floating gate FG'. The opposite is also possible, the control gate and the layer of gate oxide D2 being narrower than the floating gate.

Figure 8:
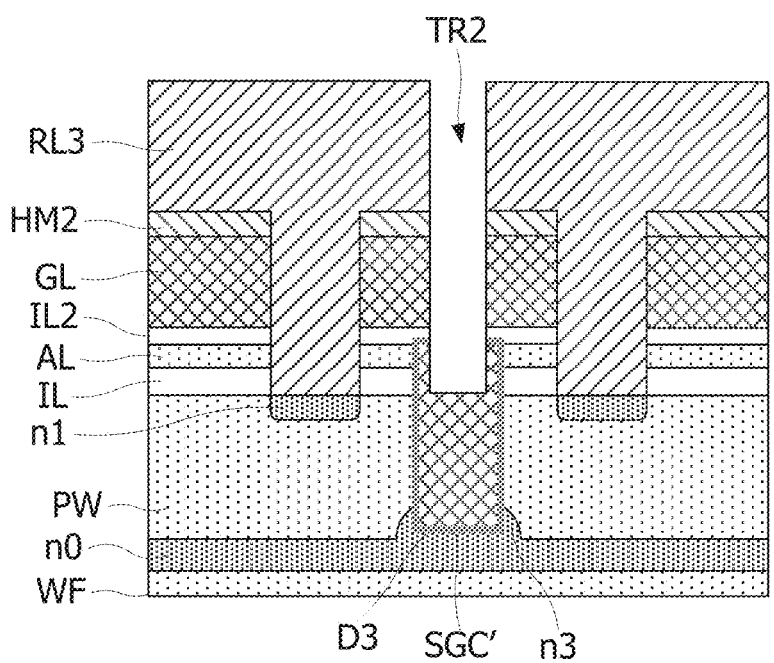
FIG. 8 is a schematic cross-section of a pair of twin memory cells at an intermediate step of manufacturing, according to one embodiment, and FIG. 9 schematically represents an example of memory circuit comprising memory cells such as those in FIG. 3.

When the trench TR2 is narrower than the trench TR, the trench TR2 may be deeper than the one shown on FIG. 6F and extend as shown by FIG. 8, in the layer "poly0" forming the common gate SGC'. It is merely important that the common gate SGC' remain isolated from the control gates CG' formed in the layer GL. Thus, the trenches TR1 and TR2 may be formed at the same time.

It can also be noted that the steps of manufacturing S11 to S16 perfectly fit into a manufacturing process for manufacturing CMOS transistors on an FDSOI wafer. The manufacturing of the memory cells involves additional manufacturing steps only to produce the vertical gate SGC, to form a thickness of dielectric layer sufficient to produce the layer of gate oxide D2 between the floating gates FG and the control gates CG. Thus the layer of gate oxide D2 may be made of different layers produced by growing or depositing, in various materials, such as silicon dioxide $SiO_2$, titanium nitride TiN, a multi-layer structure of oxide-nitride-oxide (ONO), or materials with high dielectric constant such as hafnium silicide, zirconium silicide, hafnium dioxide and zirconium dioxide. The layer of gate oxide D2 may also comprise a layer produced by successively depositing a same material. The doped regions n1 are produced at the same time as doped regions forming the drains and sources of CMOS transistors. If the doping of the doped regions n1 is insufficient to produce the drain regions n1 of the floating-gate transistor FGT sections, an additional step of implanting dopants may be provided to produce the doped regions n1' between the spacers SP1 (FIG. 6G).

In comparison with the manufacturing of memory cells in a conventional semiconductor substrate (FIG. 2), the manufacturing method that has just been described enables the steps of producing the layer of gate oxide D1 and of producing the floating gates FG by depositing and etching a layer made of polysilicon, to be removed.

It will be understood by those skilled in the art that the present disclosure is susceptible of various other alternative embodiments and applications. In particular, although the description above was of the formation of memory cells in an FDSOI wafer, one embodiment may aim to produce memory cells in a conventional semiconductor substrate. For this purpose, the layers IL, AL in which the layers of gate oxide D1 and the floating gates FG are formed may be deposited on a conventional semiconductor substrate before the formation of the vertical selection gate SGC. In this way, the selection gate SGC may extend as described above, up to the plane in which the upper face of the layer AL extends.

Furthermore, although the formation of two twin memory cells has been described above, one embodiment of the method according to the present disclosure may aim to produce "unit" memory cells, i.e., without any twin memory cell sharing the same vertical selection gate SGC.

Figure 9:
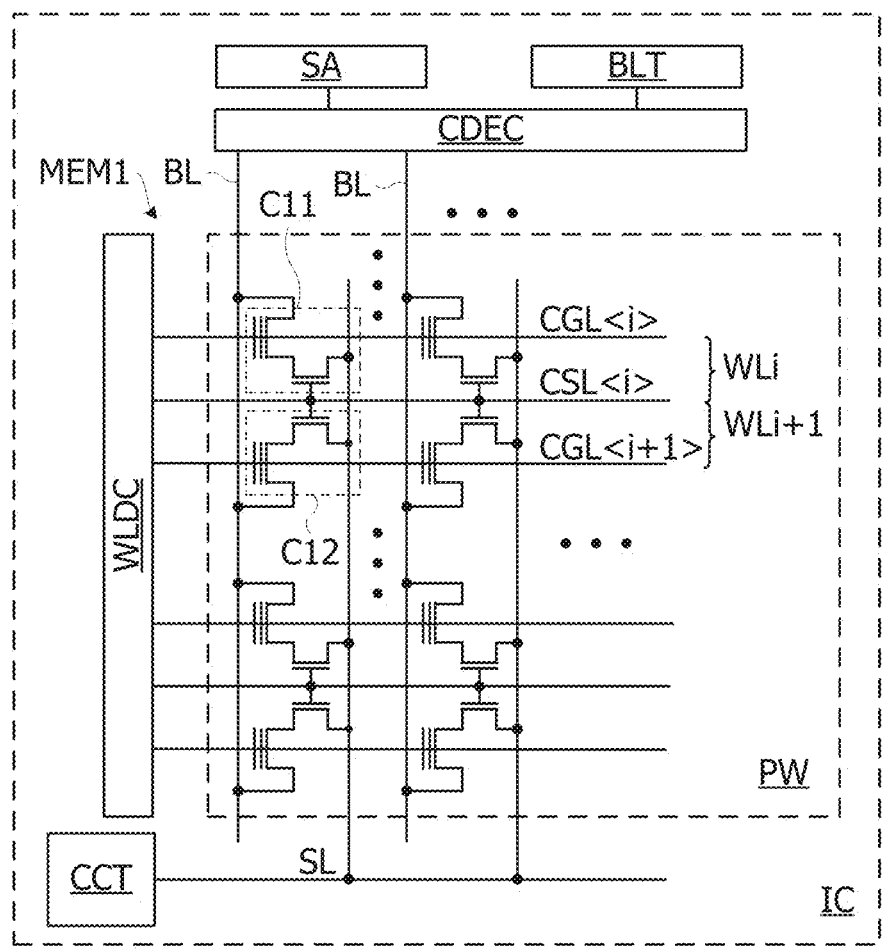

Conversely, some embodiments may aim for the collective and simultaneous production of one or more rows of twin memory cells of the type shown on FIG. 9, for example in the framework of the production of an electrically programmable and erasable memory circuit MEM1. The circuit MEM1 is produced on a semiconductor wafer and forms an integrated circuit IC. It comprises twin word lines WL<i>, WL<i+i>produced on the substrate PW, and comprising twin memory cells sharing the same select line SL<i>. The select lines SL and the control gate lines CGL are coupled to a word line decoder WLDC which applies memory cell erase, program and read voltages to them. The bit lines BL connected to the drain regions n1 of the memory cells are coupled to a set of programming latches BLT and to a set of sense amplifiers SA through a column decoder CDEC. These elements are coupled to a control circuit CCT which ensures the sequencing of programming and erasing operations compliant with the methods described above. It can be noted that providing twin memory cells of the type shown on FIG. 3 enables the decoders WLDC, CDEC and CCT to be simplified, given that the well PW and the source line CSL must always be maintained grounded and that it is not necessary to apply erase-, programming- or read-inhibit voltages to a memory cell when the twin memory cell of the latter undergoes a programming, erasing or reading operation.

It will also be understood by those skilled in the art that a memory cell according to the present disclosure is susceptible of being produced in other fields of technology, the materials mentioned in the description above, in particular the silicon, silicon dioxide and polysilicon, merely being examples.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   manufacturing in a semiconductor substrate an electrically programmable first memory cell, the manufacturing including:
   etching a first trench in the substrate, and in a first dielectric layer and a first conducting layer formed on the substrate,
   depositing on walls of the first trench a second dielectric layer,
   depositing on the substrate and in the first trench a second conducting layer and etching the second conducting layer, thereby forming a vertical selection gate extending in the first trench, up to a plane passing through an upper face of the first conducting layer,
   depositing on the first conducting layer a third dielectric layer,
   depositing on the third dielectric layer a third conducting layer,
   etching a second trench in the third conducting layer, the third dielectric layer, the first conducting layer and the first dielectric layer, and
   etching a third trench above the vertical selection gate through the third conducting layer and the third dielectric layer, so as to form between the second and third trenches a first stack of the horizontal control gate, the second gate dielectric layer, and the horizontal floating gate of the first memory cell.

2. The method according to claim 1, wherein the substrate is part of a fully-depleted silicon on insulator wafer that includes the first dielectric layer and the first conducting layer, which is made of silicon.

3. The method according to claim 1, comprising etching a fourth trench in the third conducting layer, the third dielectric layer, the first conducting layer and the first dielectric layer, thereby forming between the third and fourth trenches a second stack of a control gate and of a floating gate of a second memory cell sharing the vertical selection gate with the first memory cell.

4. The method according to claim 1, comprising implanting in the substrate a conducting plane forming a source line for the first memory cell.

5. The method according to claim 1, comprising implanting dopants at the bottom of the second trench, thereby forming a drain region of a floating-gate transistor of the first memory cell.

6. The method according to claim 1, wherein the first dielectric layer has a thickness between 10 and 30 nm and the first conducting layer has a thickness between 8 and 15 nm.

7. The method of claim 1, comprising manufacturing an integrated circuit that includes the first memory cell.

8. A method, comprising:
   forming a first memory cell by steps including:
   forming a selection gate extending vertically in a first trench made in a semiconductor substrate;
   forming a first gate dielectric insulating the selection gate from the substrate;
   forming a first vertical channel region extending in the substrate along the first gate dielectric;
   forming a horizontal first floating gate extending above the substrate;

forming a second gate dielectric insulating the first floating gate from the substrate;
forming a horizontal first control gate extending above the first floating gate; and
forming an embedded collective source layer in electrical contact with the first vertical channel region, the collective source layer being configured to collect programming currents for programming the first memory cell and other memory cells formed in the substrate, wherein the selection gate covers a lateral face of the first floating gate, the first floating gate being separated from the selection gate only by the first gate dielectric and being separated from the first vertical channel region by the second gate dielectric.

9. The method according to claim 8, wherein:
the substrate is part of a fully-depleted silicon on insulator wafer that also includes a dielectric layer formed on the substrate and a layer of silicon formed on the dielectric layer;
forming the first floating gate includes forming the first floating gate in the layer of silicon; and
forming the second gate dielectric includes forming the second gate dielectric in the dielectric layer.

10. The method according to claim 8, wherein the first floating gate and the selection gate have respective top surfaces that are coplanar with each other.

11. The method according to claim 8, further comprising:
forming a second memory cell that shares the selection gate with the first memory cell and shares the collective source layer with the first memory cell and the other memory cells formed in the substrate, forming the second memory cell including:
forming a third gate dielectric insulating the selection gate from the substrate;
forming a second vertical channel region extending in the substrate along the third gate dielectric;
forming a horizontal second floating gate extending above the substrate;
forming a fourth gate dielectric insulating the second floating gate from the substrate; and
forming a horizontal second control gate extending above the second floating gate, wherein the selection gate covers a lateral face of the second floating gate, and the second floating gate is separated from the selection gate by the third gate dielectric and is separated from the second vertical channel region by the fourth gate dielectric.

12. The method according to claim 11, wherein:
the substrate is part of a fully-depleted silicon on insulator wafer that also includes a dielectric layer formed on the substrate and a layer of silicon formed on the dielectric layer;
forming the first and second floating gates includes forming the first and second floating gates in the layer of silicon, and
forming the second and fourth gate dielectrics includes forming the second and fourth gate dielectrics in the dielectric layer.

13. The method according to claim 11, wherein the first and second floating gates and the selection gate have respective top surfaces that are coplanar with each other.

14. A method of making a memory circuit, the method comprising:
forming a memory array including forming a plurality of memory cells, forming each memory cell including:
forming a selection gate extending vertically in a first trench made in a semiconductor substrate forming a first gate dielectric layer insulating the selection gate from the substrate;
forming a vertical channel region extending in the substrate along the first gate dielectric layer;
forming a horizontal floating gate extending above the substrate;
forming a second gate dielectric layer insulating the horizontal floating gate from the substrate;
forming a horizontal control gate extending above the floating gate; and
forming an embedded layer forming a collective source plane in electrical contact with the vertical channel region, the collective source plane being configured to collect programming currents for programming the first and second memory cells and other memory cells formed in the substrate, wherein the selection gate covers a lateral face of the floating gate, the floating gate being separated from the selection gate only by the first gate dielectric layer and being separated from the vertical channel region by the second gate dielectric layer.

15. The method of claim 14, further comprising forming a programming circuit configured to program each memory cell by applying electric potentials to the substrate, to the vertical selection gate, to the control gate and to drain and source regions of the memory cell, such that hot electrons are injected into the floating gate via the vertical channel region through the second gate dielectric layer.

16. The method of claim 14, further comprising forming a erase circuit configured to erase the memory cell, by applying electric potentials to the substrate, to the vertical selection gate, to the control gate and to drain and source regions of the memory cell, such that electric charges are extracted from the floating gate directly via the vertical selection gate.

17. The method of claim 14, comprising:
etching the first trench in the semiconductor substrate, and in a first dielectric layer and a first conducting layer formed on the semiconductor substrate;
depositing on walls of the first trench the first gate dielectric layer; and
depositing on the substrate and in the first trench a second conducting layer and etching the second conducting layer, thereby forming the selection gate extending in the first trench, up to a plane passing through an upper face of the first conducting layer.

18. The method of claim 17, comprising:
depositing on the first conducting layer a second dielectric layer,
depositing on the second dielectric layer a third conducting layer,
etching a second trench in the third conducting layer, the second dielectric layer, the first conducting layer and the first dielectric layer, and
etching a third trench above the vertical selection gate through the third conducting layer and the second dielectric layer, so as to form between the second and third trenches a first stack of the horizontal control gate, the second gate dielectric layer, and the horizontal floating gate of the first memory cell.

19. The method of claim 8, comprising:
etching the first trench in the semiconductor substrate, and in a first dielectric layer and a first conducting layer formed on the semiconductor substrate;
depositing on walls of the first trench the first gate dielectric layer; and depositing on the substrate and in the first trench a second conducting layer and etching the second conducting layer, thereby forming the selection gate extending in the first trench, up to a plane passing through an upper face of the first conducting layer.

20. The method of claim 19, comprising:

depositing on the first conducting layer a second dielectric layer, depositing on the second dielectric layer a third conducting layer, etching a second trench in the third conducting layer, the second dielectric layer, the first conducting layer and the first dielectric layer, and etching a third trench above the vertical selection gate through the third conducting layer and the second dielectric layer, so as to form between the second and third trenches a first stack of the horizontal control gate, the second gate dielectric layer, and the horizontal floating gate of the first memory cell.

* * * * *